US012532441B2

(12) United States Patent
Tai et al.

(10) Patent No.: US 12,532,441 B2
(45) Date of Patent: Jan. 20, 2026

(54) DISPLAY DEVICE

(71) Applicant: AUO Display Plus Corporation, Hsinchu (TW)

(72) Inventors: Chen-Yu Tai, Hsinchu (TW); Nan-Ching Lee, Hsinchu (TW)

(73) Assignee: AUO DISPLAY PLUS CORPORATION, Hsinchu (TW)

( * ) Notice: Subject to any disclaimer, the term of this patent is extended or adjusted under 35 U.S.C. 154(b) by 179 days.

(21) Appl. No.: 18/370,902

(22) Filed: Sep. 21, 2023

(65) Prior Publication Data
US 2024/0107724 A1    Mar. 28, 2024

(30) Foreign Application Priority Data
Sep. 23, 2022    (TW) ................. 111136254

(51) Int. Cl.
| | |
|---|---|
| *H05K 7/00* | (2006.01) |
| *H05K 7/20* | (2006.01) |
| *H05K 9/00* | (2006.01) |

(52) U.S. Cl.
CPC ....... *H05K 7/20972* (2013.01); *H05K 9/0054* (2013.01)

(58) Field of Classification Search
CPC ........... H05K 7/20972; H05K 7/20145; H05K 7/20172; H05K 7/202
See application file for complete search history.

(56) References Cited

U.S. PATENT DOCUMENTS

| | | | |
|---|---|---|---|
| 8,063,868 B2 | 11/2011 | Sugitani et al. | |
| 8,472,174 B2 * | 6/2013 | Idems ................. | H05K 7/20972 361/679.21 |
| 8,514,364 B2 | 8/2013 | Mikubo et al. | |
| 9,285,846 B2 * | 3/2016 | Degner ............... | H05K 7/20163 |
| 10,165,712 B1 * | 12/2018 | Jang ..................... | G09F 15/0006 |
| 10,194,564 B2 * | 1/2019 | Dunn .................. | H05K 7/20145 |
| 10,278,311 B2 * | 4/2019 | DeMars ............. | H05K 7/20972 |
| 10,398,066 B2 * | 8/2019 | Dunn ................. | G02F 1/133385 |
| 10,405,456 B2 * | 9/2019 | Jang ......................... | G09F 9/30 |
| 10,492,345 B2 * | 11/2019 | Kim .................. | H05K 7/20209 |
| 10,492,346 B2 * | 11/2019 | Selvakumar ....... | G02B 27/0006 |
| 10,506,738 B2 * | 12/2019 | Dunn ................. | H05K 7/20154 |
| 10,653,045 B2 * | 5/2020 | Chang ................ | H05K 7/20972 |

(Continued)

FOREIGN PATENT DOCUMENTS

TW    M244514 U    9/2004

*Primary Examiner* — Rockshana D Chowdhury
(74) *Attorney, Agent, or Firm* — WPAT, PC

(57) ABSTRACT

A display device is provided, including a housing, a panel, two outer circulation assemblies, an inner circulation assembly, and an optical device. The housing includes a closed inner space and a first side surface and a second side surface opposite to each other. The panel is adjacent to the first side surface and the second side surface. The two outer circulation assemblies are respectively arranged on the first side surface and the second side surface, and includes an air duct element to guides an air and a fan assembly. The air duct element guides an air. The inner circulation assembly is arranged in the inner space and includes a first fan element and a second fan element. The first fan element and the second fan element are arranged on two opposite ends. The optical device is arranged in the inner space and located on an end opposite to the panel.

18 Claims, 10 Drawing Sheets

(56) References Cited

U.S. PATENT DOCUMENTS

| | | | | |
|---|---|---|---|---|
| 10,782,276 B2* | 9/2020 | Dunn | | G08B 17/10 |
| 10,820,445 B2* | 10/2020 | Diaz | | H05K 7/20145 |
| 10,827,656 B2* | 11/2020 | Hubbard | | H05K 7/20145 |
| 11,252,849 B2* | 2/2022 | Whitehead | | G02F 1/133385 |
| 11,262,817 B2* | 3/2022 | Chin | | G01K 13/024 |
| 11,320,875 B2* | 5/2022 | Lee | | G06F 1/20 |
| 11,778,757 B2* | 10/2023 | Dunn | | H05K 5/03 |
| | | | | 361/679.46 |
| 11,822,171 B2* | 11/2023 | Dunn | | H05K 5/0226 |
| 11,860,462 B2* | 1/2024 | Wang | | H05K 7/20972 |
| 11,899,511 B2* | 2/2024 | Whang | | H01L 23/4093 |
| 12,010,813 B2* | 6/2024 | Dunn | | B60L 53/305 |
| 12,035,486 B1* | 7/2024 | Dunn | | H05K 7/20954 |
| 12,039,894 B2* | 7/2024 | Dunn | | G09F 13/0495 |
| 2010/0182562 A1* | 7/2010 | Yoshida | | H05K 7/20972 |
| | | | | 349/161 |
| 2011/0058326 A1* | 3/2011 | Idems | | G09F 9/30 |
| | | | | 361/679.21 |
| 2011/0085302 A1* | 4/2011 | Nakamichi | | H05K 7/20972 |
| | | | | 361/695 |
| 2011/0122581 A1* | 5/2011 | Chen | | H05K 7/202 |
| | | | | 361/695 |
| 2011/0134603 A1* | 6/2011 | Yeh | | H05K 7/20145 |
| | | | | 361/679.47 |
| 2014/0098493 A1* | 4/2014 | Chen | | H05K 7/20145 |
| | | | | 165/104.34 |
| 2014/0334100 A1* | 11/2014 | Yoon | | G06F 1/20 |
| | | | | 361/748 |
| 2014/0362523 A1* | 12/2014 | Degner | | G02B 6/0008 |
| | | | | 361/679.47 |
| 2018/0020579 A1* | 1/2018 | Chang | | H05K 7/20154 |
| 2018/0088368 A1* | 3/2018 | Notoshi | | G02B 6/0085 |
| 2018/0088398 A1* | 3/2018 | Lee | | H05K 7/20145 |
| 2023/0047942 A1* | 2/2023 | Kim | | H05K 7/20154 |
| 2024/0121910 A1* | 4/2024 | Zhang | | H05K 7/20709 |

* cited by examiner

DISPLAY DEVICE

CROSS-REFERENCE TO RELATED APPLICATION

This non-provisional application claims priority under 35 U.S.C. § 119(a) to Patent Application No. 111136254 filed in Taiwan, R.O.C. on Sep. 23, 2022, the entire contents of which are hereby incorporated by reference.

BACKGROUND

Technical Field

The present invention relates to a display device, and in particular, to a display device having an inner circulation assembly and an outer circulation assembly.

Related Art

A conventional display device is generally provided with an active heat dissipation mechanism or a passive heat dissipation mechanism on a back light module, such as a fan and a heat sink fin. However, the heat dissipation mechanism cannot effectively dissipate heat from a polarizer of the display device. When the polarizer is irradiated by a heat source, a screen display is easily abnormal due to a chemical reaction caused by the temperature, and an air in the display device is heated by an external heat source and a back light device, and thermal energy accumulation occurs.

SUMMARY

Based on the above, a display device is provided in an embodiment, which includes a housing, a panel, two outer circulation assemblies, an inner circulation assembly, and an optical device. The housing includes a closed inner space, and a first side surface and a second side surface opposite to each other. The panel is connected to the first side surface and the second side surface. The two outer circulation assemblies are respectively arranged on the first side surface and the second side surface. Each of the outer circulation assemblies includes an air duct element and a fan assembly. The air duct element guides an air flow generated by the fan assembly to the panel. The inner circulation assembly is arranged in the inner space. The inner circulation assembly includes a first fan element and a second fan element. The first fan element and the second fan element are arranged on two opposite ends. The optical device is arranged in the inner space and located between the first side surface and the second side surface on an end opposite to the panel.

In some embodiments, the air duct element of each of the two outer circulation assemblies includes a flow channel, an air inlet, and an air outlet. The air inlet is arranged in a direction perpendicular to a plane of the first side surface and the second side surface, and the air outlet faces the panel.

In some embodiments, the air duct element of each of the two outer circulation assemblies includes a flow channel, an air inlet, and an air outlet. The air inlet is arranged in a direction parallel to a plane of the first side surface and the second side surface. The air outlet faces the panel.

In some embodiments, the panel has a first panel portion and a second panel portion. The first panel portion and the second panel portion are arranged opposite to each other at an angle.

In some embodiments, the fan assembly includes a first fan set and a second fan set. The first fan set is arranged parallel to the first panel portion. The second fan set is arranged parallel to the second panel portion.

In some embodiments, the air duct element is provided with a flow guide structure. The flow guide structure has a plurality of first spacers and a plurality of second spacers. Each of the first spacers has a first section and a second section. Each of the second spacers has a third section and a fourth section. The first section and the third section extend away from the fan assembly. The second section and the fourth section respectively extend toward the first panel portion and the second panel portion.

In some embodiments, the first fan element and the second fan element are arranged at opposite corners.

In some embodiments, the first fan element is arranged on an end of the optical device close to the first side surface, and the second fan element is arranged on an end of the optical device close to the second side surface.

In some embodiments, a dust-proof element is included. The dust-proof element is arranged between the inner circulation assembly and the optical device.

In some embodiments, the outer circulation assembly includes a heat sink fin, a heat filter, and a cooling chip. The heat filter is arranged on the air duct element. The cooling chip is arranged on the heat filter. The heat sink fin is arranged on the heat filter.

Based on the above, a display device is provided in an embodiment. The outer circulation assembly guides the air flow generated by the fan assembly to the panel through the air duct element. The inner circulation assembly is located in a closed inner space. Through the inner circulation assembly and the outer circulation assembly independent from each other, heat dissipation is performed on both the panel and cavity of the display device, and accumulation of thermal energy of the display device is reduced.

DETAILED DESCRIPTION

Figure 1:
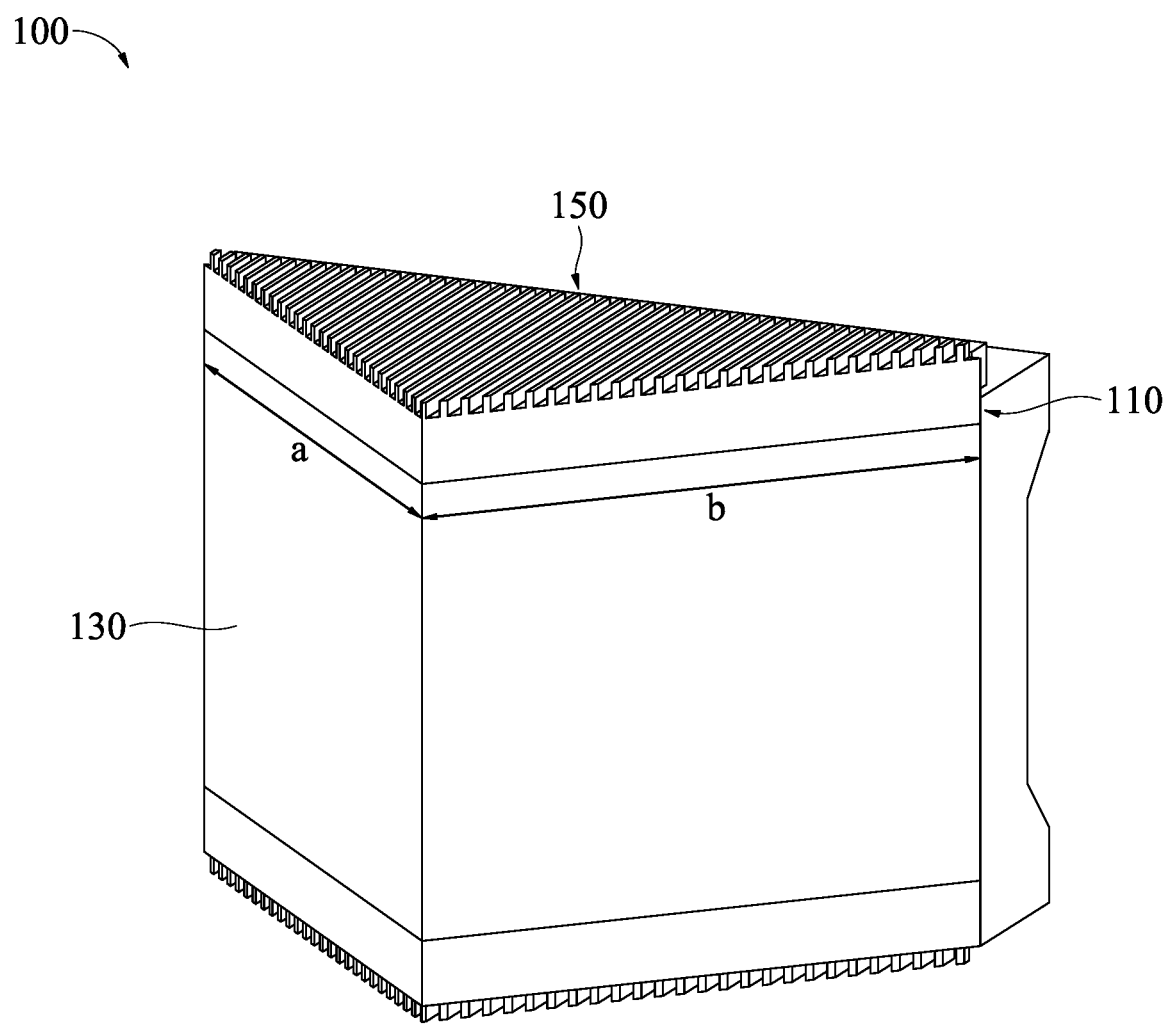
FIG. 1 is a three-dimensional view of a display device according to a first embodiment.
Figure 2:
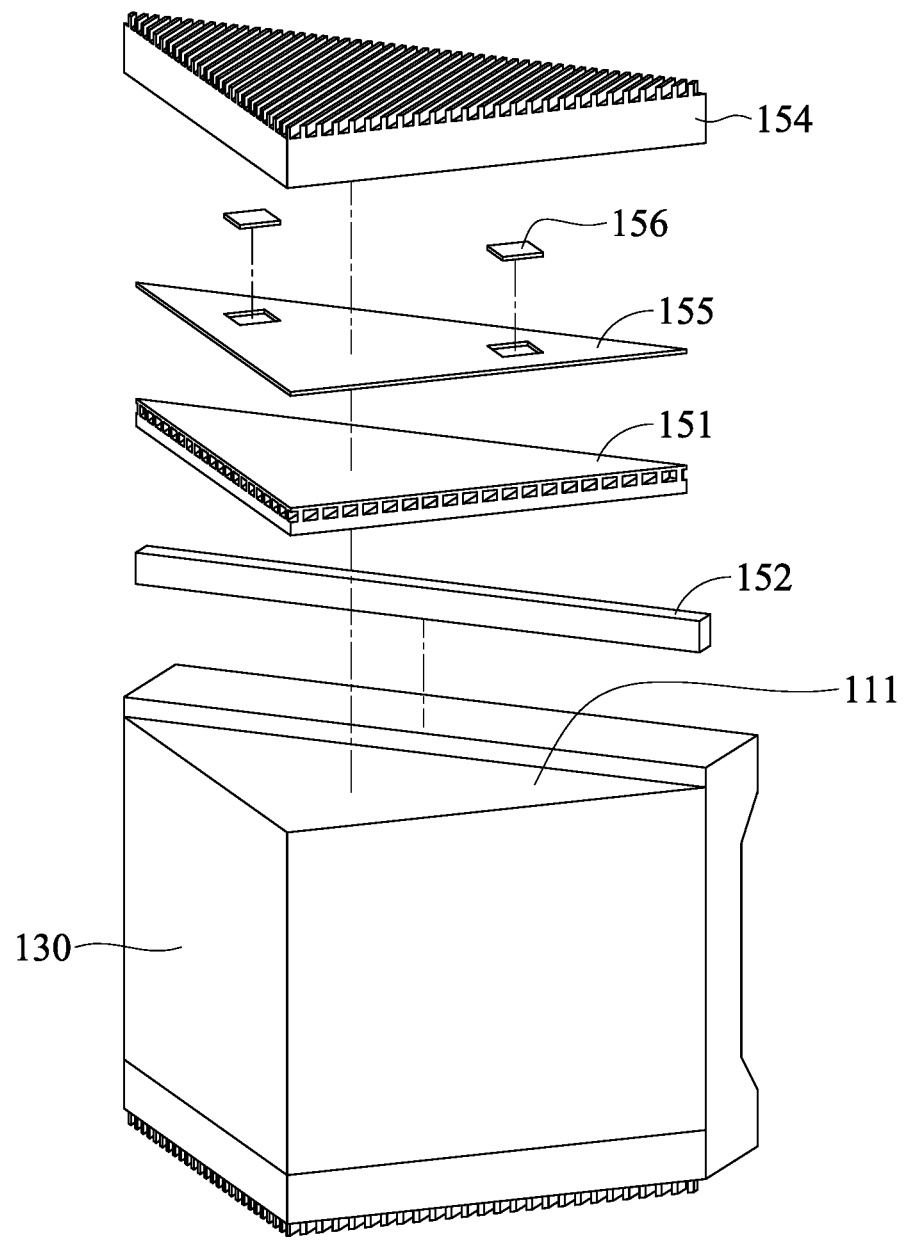
FIG. 2 is a partial exploded view of a display device according to a first embodiment.
Figure 3A:
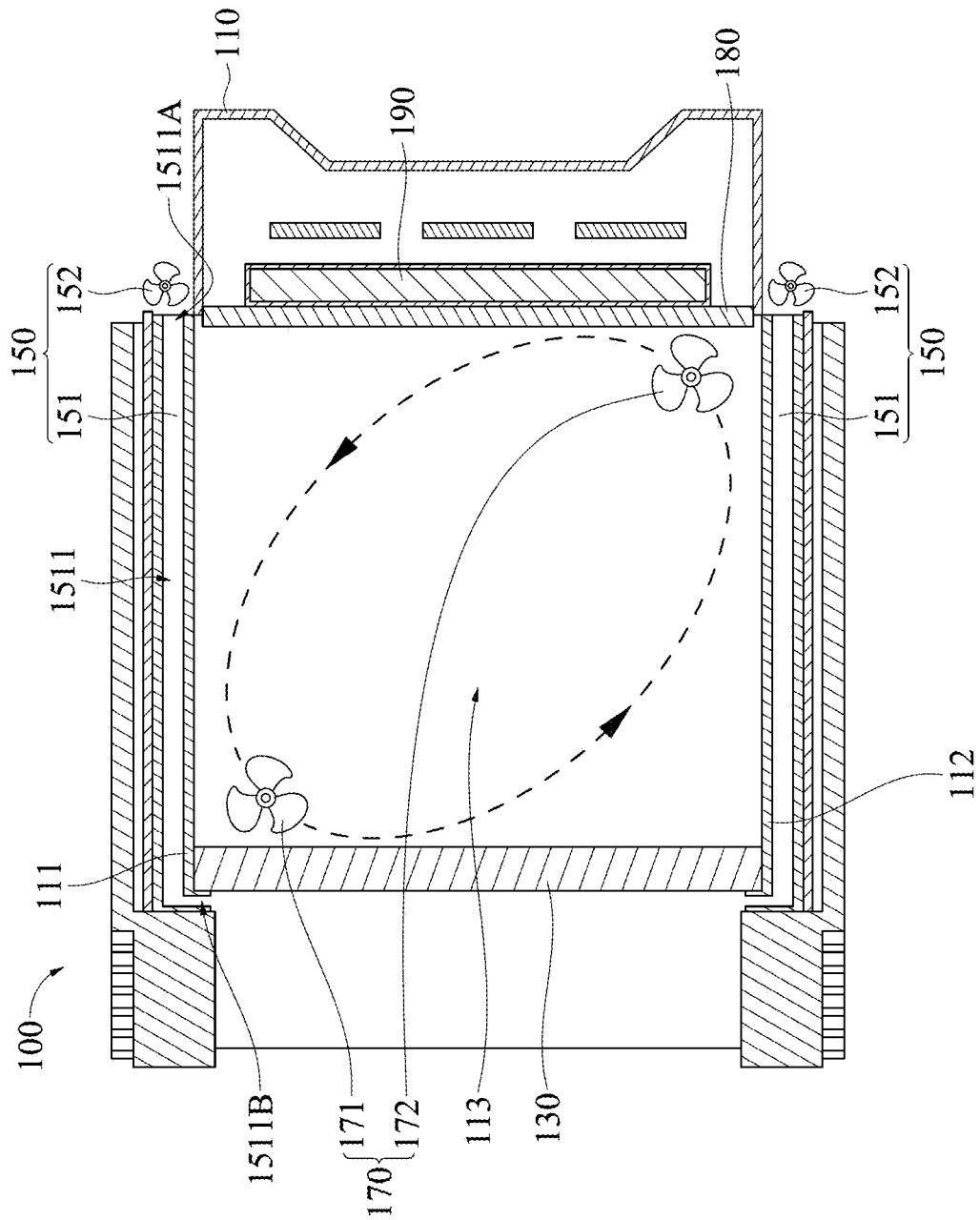
FIG. 3A is a schematic diagram (1) of an inner space of a display device according to a first embodiment.
Figure 3B:
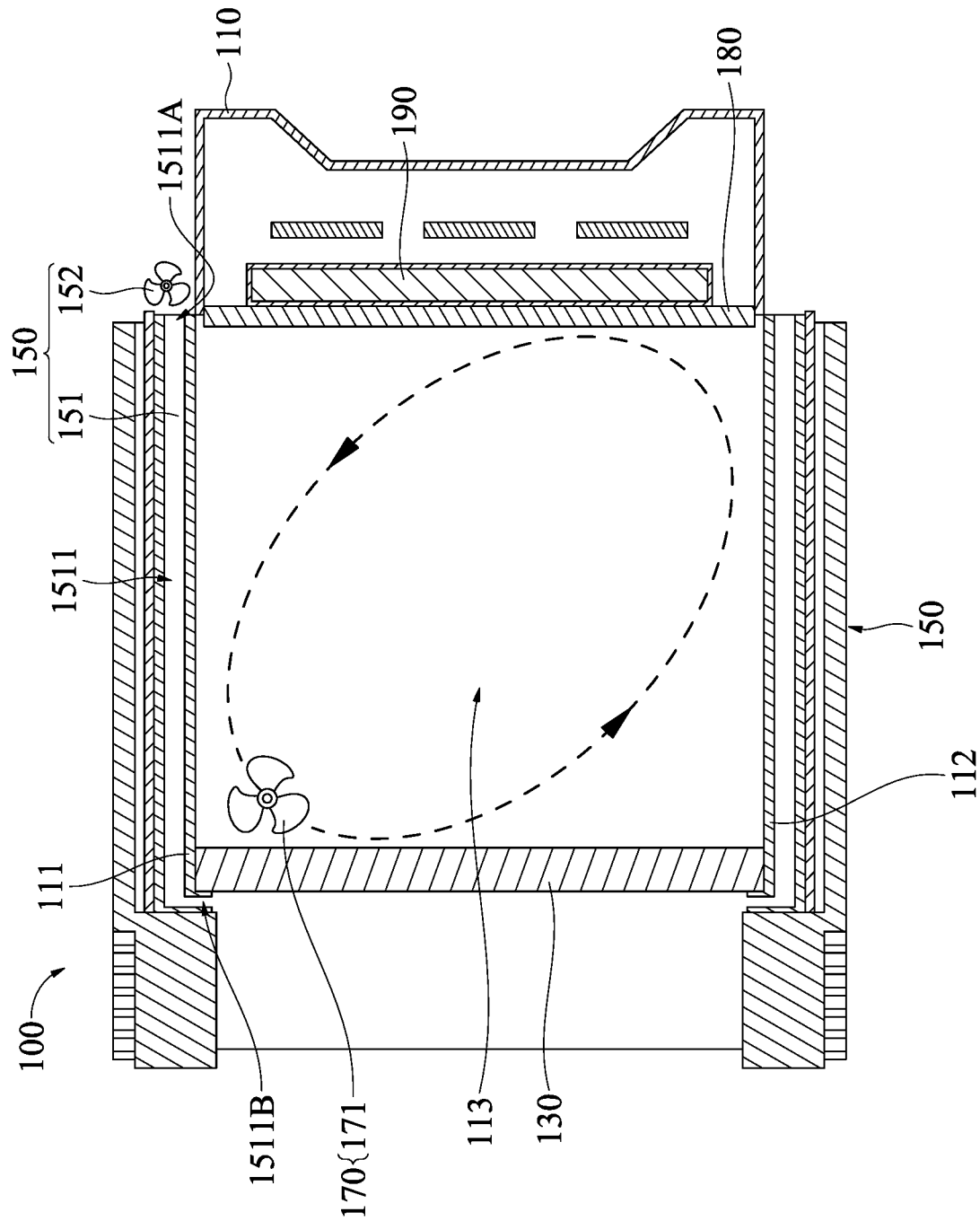
FIG. 3B is a schematic diagram (2) of an inner space of a display device according to another embodiment.
Figure 4:
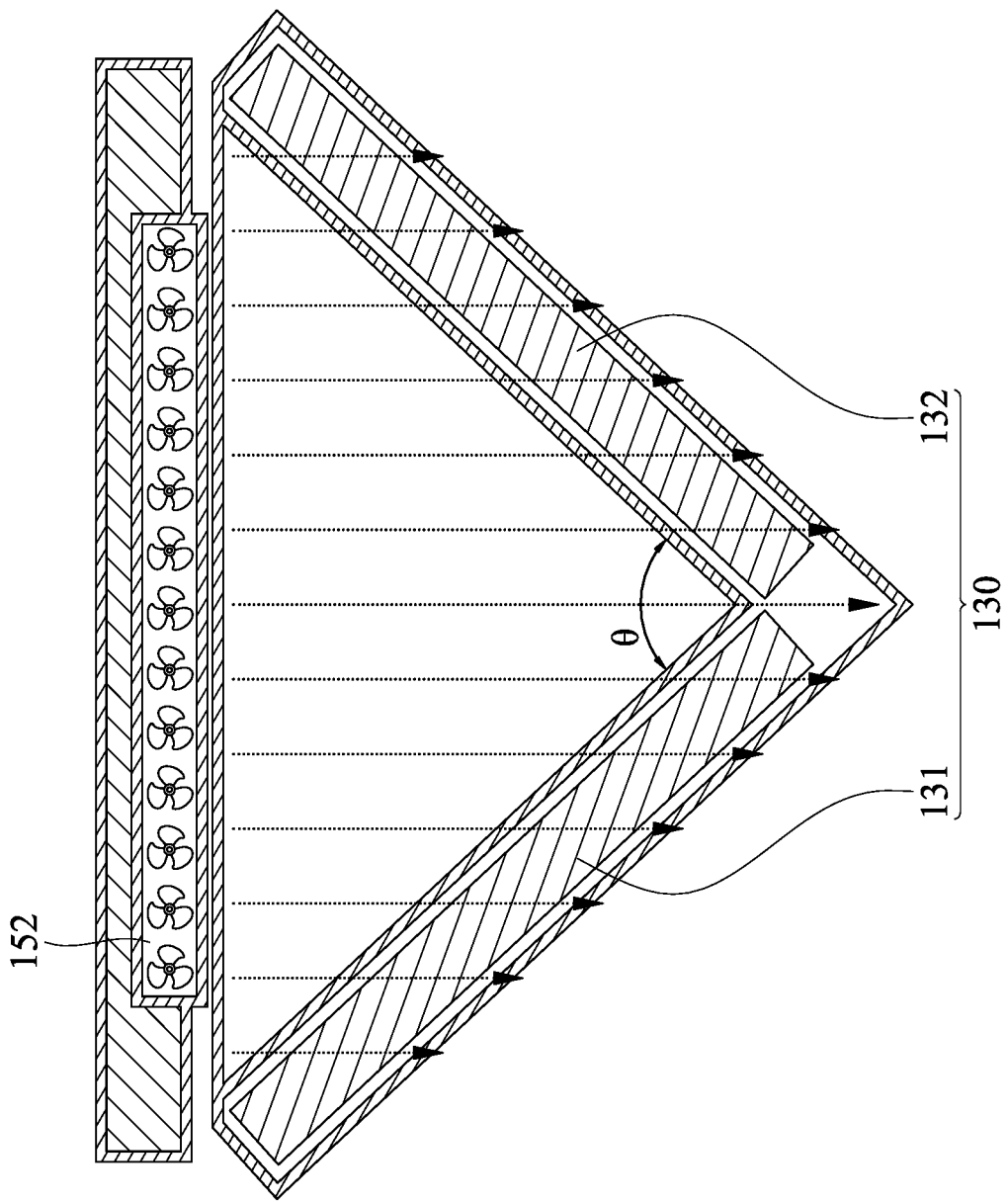
FIG. 4 is a schematic diagram of air flow of an air duct assembly of a display device according to a first embodiment.

Refer to FIG. 1 to FIG. 4. FIG. 1 is a three-dimensional view of a display device according to a first embodiment. FIG. 2 is a partial exploded view of a display device according to a first embodiment. FIG. 3A is a schematic diagram (1) of an inner space of a display device according to a first embodiment. FIG. 3B is a schematic diagram (2) of an inner space of a display device according to another embodiment. FIG. 4 is a schematic diagram of air flow of an air duct assembly according to a first embodiment. A display device 100 is provided, including a housing 110, a panel 130, two outer circulation assemblies 150, an inner circulation assembly 170, and an optical device 190. In the first embodiment, the display device 100 is, for example, a three-dimensional display device, which is applicable to an outdoor electronic signage board or the like.

As shown in FIG. 1 to FIG. 4, the housing 110 includes a closed inner space 113, and a first side surface 111 and a second side surface 112 opposite to each other. The panel 130 is connected to the first side surface 111 and the second side surface 112. According to FIG. 3A, a display surface of the panel 130 is exposed to the outside of the housing 110 and an opposite surface of the display surface is faced to the inner space 113. In the first embodiment, the inner space 113 of the housing 110 is closed, that is, an air in the inner space 113 and an air outside the display device 100 are not in communication with each other.

As shown in FIG. 3A, the two outer circulation assemblies 150 are respectively arranged on the first side surface 111 and the second side surface 112, to simultaneously dissipate heat from the first side surface 111 and the second side surface 112. Each outer circulation assembly 150 includes an air duct element 151 and a fan assembly 152. The air duct element 151 has a flow channel 1511 to direct an air flow generated by the fan assembly 152 to the panel 130. The first side surface 111 is used for description. While the outer circulation assembly 150 dissipates heat from the display device 100, the air flow may further be generated through the fan assembly 152 on the first side surface 111, and the air flow flows to the panel 130 through the air duct element 151 to dissipate heat from the panel 130. Referring to FIG. 2, the outer circulation assembly 150 further includes a heat sink fin 154, a heat filter 155, and a cooling chip 156. The first side surface 111 is used as an example for description. The air duct element 151 is arranged on the first side surface 111. In addition to using the air duct element 151 to achieve an effect of external circulation heat dissipation, the outer circulation assembly 150 may further be configured as a cooling surface of the inner circulation. The heat filter 155 is arranged on the air duct element 151, and the heat filter 155 is provided with the cooling chip 156. Further, the heat sink fin 154 is arranged on the heat filter 155 to further increase the heat dissipation effect through the heat sink fin 154, the heat filter 155, and the cooling chip 156. In the first embodiment, the two outer circulation assemblies 150 are respectively arranged on the first side surface 111 and the second side surface 112, but are not limited thereto. As shown in FIG. 3B, in another embodiment, there may be only one of outer circulation assembly 150 and is arranged on the first side surface 111. In some embodiments, the outer circulation assembly 150 can also be arranged on the second side surface 112.

As shown in FIG. 3A and FIG. 4, the inner circulation assembly 170 is arranged in the inner space 113. The inner circulation assembly 170 includes a first fan element 171 and a second fan element 172. The first fan element 171 and the second fan element 172 are arranged at opposite ends. The optical device 190 is arranged in the inner space 113 and located between the first side surface 111 and the second side surface 112 on an end opposite to the panel 130. In the first embodiment, the first fan element 171 and the second fan element 172 are configured to dissipate heat from the inner space 113 of the display device 100 and the optical device 190 located in the inner space 113. Accordingly, it could be understood that the inner circulation assembly 170 also dissipates heat of the opposite surface of the display surface of the panel 130 from the inner space 113. In the first embodiment, the optical device 190 includes a back light module, a circuit board assembly, and the like. In the first embodiment, a size of the housing 110 is determined by sizes a and b of the outer circulation assembly 150. For example, when the sizes a and b of the outer circulation assembly 150 are, for example, 21.5 inches to 85 inches, assembling is performed with a selected outer circulation assembly 150 by using the proper housing 110. In addition, in the first embodiment, two fan elements are arranged, but is not limited thereto. As shown in FIG. 3B, in another embodiment, one fan element is arranged. Arrangement positions of the first fan element 171 and the second fan element 172 have various implementations. In the first embodiment, the first fan element 171 and the second fan element 172 are diagonally arranged at opposite ends to increase an air circulation efficiency of upper and lower sides of the inner space 113, but is not limited thereto. Details are provided later on the implementation of another arrangement position.

Specifically, the outer circulation assembly 150 of the display device 100 guides the air flow generated by the fan assembly 152 to the panel 130 through the air duct element 151 to dissipate heat from the panel 130. The inner circulation assembly 170 dissipates heat from the inner space 113 of the display device 100 and the optical device 190 located in the inner space 113 by using the first fan element 171 and the second fan element 172. In this way, through the inner circulation assembly and the outer circulation assembly independent from each other, which means an air flow of the two outer circulation assemblies 150 and an airflow of the inner circulation assembly 170 are independent from each other. The two outer circulation assemblies 150 dissipate heat from the outside of the display device 100 and the inner circulation assembly 170 dissipates heat inside the inner space 113. Therefore, heat dissipation is performed on both the outside and inside of the display device 100, and accumulation of thermal energy of the display device 100 is reduced.

Still referring to FIG. 3A and FIG. 4, in the first embodiment, each air duct element 151 of the two outer circulation assemblies 150 includes an air inlet 1511A and an air outlet 1511B. The air inlet 1511A is arranged in a direction parallel to a plane of the first side surface 111 and the second side surface 112, and the air outlet 1511B faces the panel 130. In this way, the fan assembly 152 is arranged in the air inlet 1511A, and the generated air flow flows from the air inlet 1511A to the air outlet 1511B. As shown by the arrows in FIG. 4, the air flow generated by the fan assembly 152 flows to the panel 130 for heat dissipation.

As shown in FIG. 4, in the first embodiment, the panel 130 has a first panel portion 131 and a second panel portion 132. The first panel portion 131 and the second panel portion 132 are arranged opposite to each other at an angle. Specifically, the first panel portion 131 and the second panel portion 132 can be arranged opposite to each other at a specific angle based on an actual usage condition. As shown in FIG. 4, an included angle θ between the first panel portion 131 and the second panel portion 132 is about an angle θ of 30° to 150°. Here, approximately 90° is used as an example. An L-shaped panel is arranged, but is not limited thereto, and another angle may further be used.

Still referring to FIG. 3A, the display device 100 includes a dust-proof element 180. The dust-proof element is arranged between the inner circulation assembly 170 and the optical device 190, to avoid moisture and dust contamination near a side of the panel 130.

Figure 5:
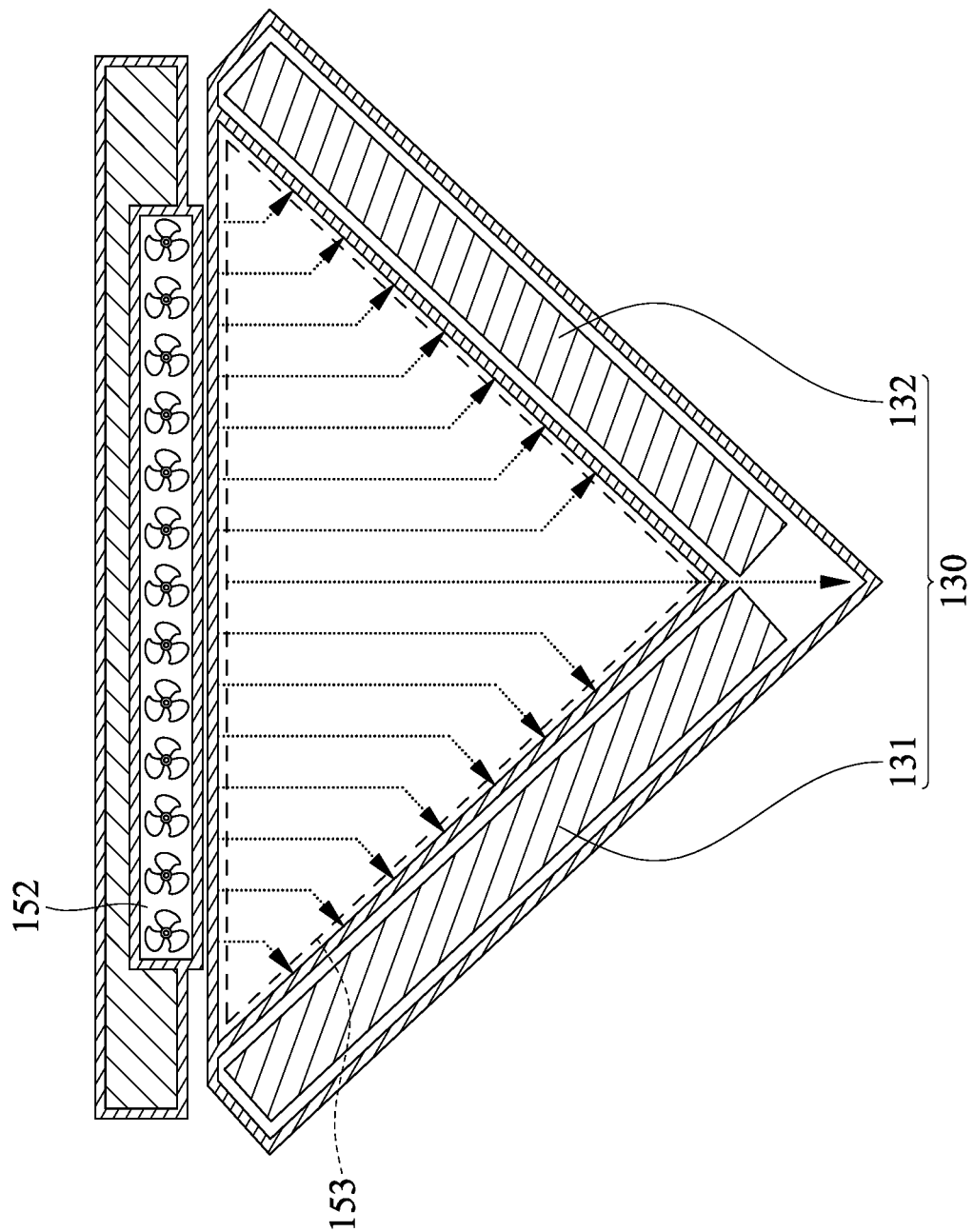
FIG. 5 is a schematic diagram of air flow of an air duct assembly of a display device according to a second embodiment.
Figure 6:
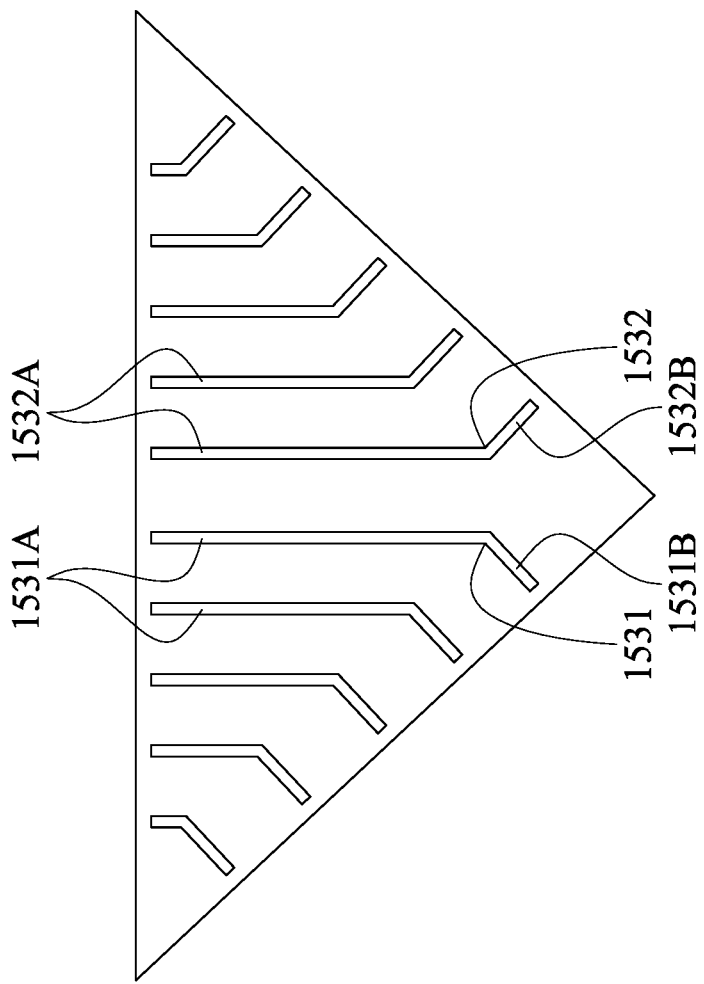
FIG. 6 is a schematic diagram of a flow guide structure of a display device according to a second embodiment.

Refer to FIG. 5 and FIG. 6. FIG. 5 is a schematic diagram of air flow of an air duct assembly of a display device according to a second embodiment. FIG. 6 is a schematic diagram of a flow guide structure of a display device according to a second embodiment. In the second embodiment, the air duct element 151 is provided with a flow guide structure 153. The flow guide structure 153 has a plurality of first spacers 1531 and a plurality of second spacers 1532. Each of the first spacers 1531 has a first section 1531A and a second section 1531B. Each of the second spacers 1532 has a third section 1532A and a fourth section 1532B. The first section 1531A and the third section 1532A extend in a direction away from the fan assembly 152. The second section 1531B and the fourth section 1532B respectively extend toward the first panel portion 131 and the second panel portion 132. In the second embodiment, the first section 1531A of the first spacer 1531 and the third section 1532A of the second spacer 1532 extend in a direction of a rotation axis of the fan assembly 152 (perpendicular to the arrangement direction of the fan assembly 152). Specifically, the flow guide structure 153 is arranged in the air duct element 151, so as to separate the flow channel 1511 into a plurality of flow channels through a plurality of first spacers 1531 and a plurality of second spacers 1532, and respectively guide the air flow to the first panel portion 131 and the second panel portion 132 (as shown by the arrows in FIG. 5). In this way, an effect of averaging heat dissipation on the panel 130 is achieved.

In addition, in the second embodiment, corresponding to a design of different flow channels 1511, it is necessary to consider a laminar and turbulent flow distribution of the air inside the flow channel. In addition, parameters such as a heat conversion amount H, a total air flow channel W, a specific heat of air Cp, a rising temperature $\Delta T$ in a cavity, an air volume CFM, an air density D, and an air volume Q required for cooling may also be different. Therefore, it is necessary to calculate and simulate the parameters, and then select a proper fan assembly 152. The evaluation manner is calculated by the following formulas:

$$W = CFM \times D$$

$$H = Cp \times W \times \Delta T$$

$$Q = H/(\Delta T \times Cp \times D)$$

Further, selection of the fan assembly 152 is also related to the cooling chip 156. A cooling efficiency COPc and a heating efficiency COPh of the cooling chip 156 are calculated based on a cooling capacity Qc of a cold end, a heating capacity Qh of a hot end, and an input electric power P. The formulas are as follows:

$$COPc = Qc/P$$

$$COPh = Qh/P$$

In this way, by simulating the parameters obtained by the above calculation in the designed flow channel, the laminar and turbulence distribution of the air in the flow channel are determined, so as to select a proper fan assembly 152 and the cooling chip 156 to be matched.

Figure 7:
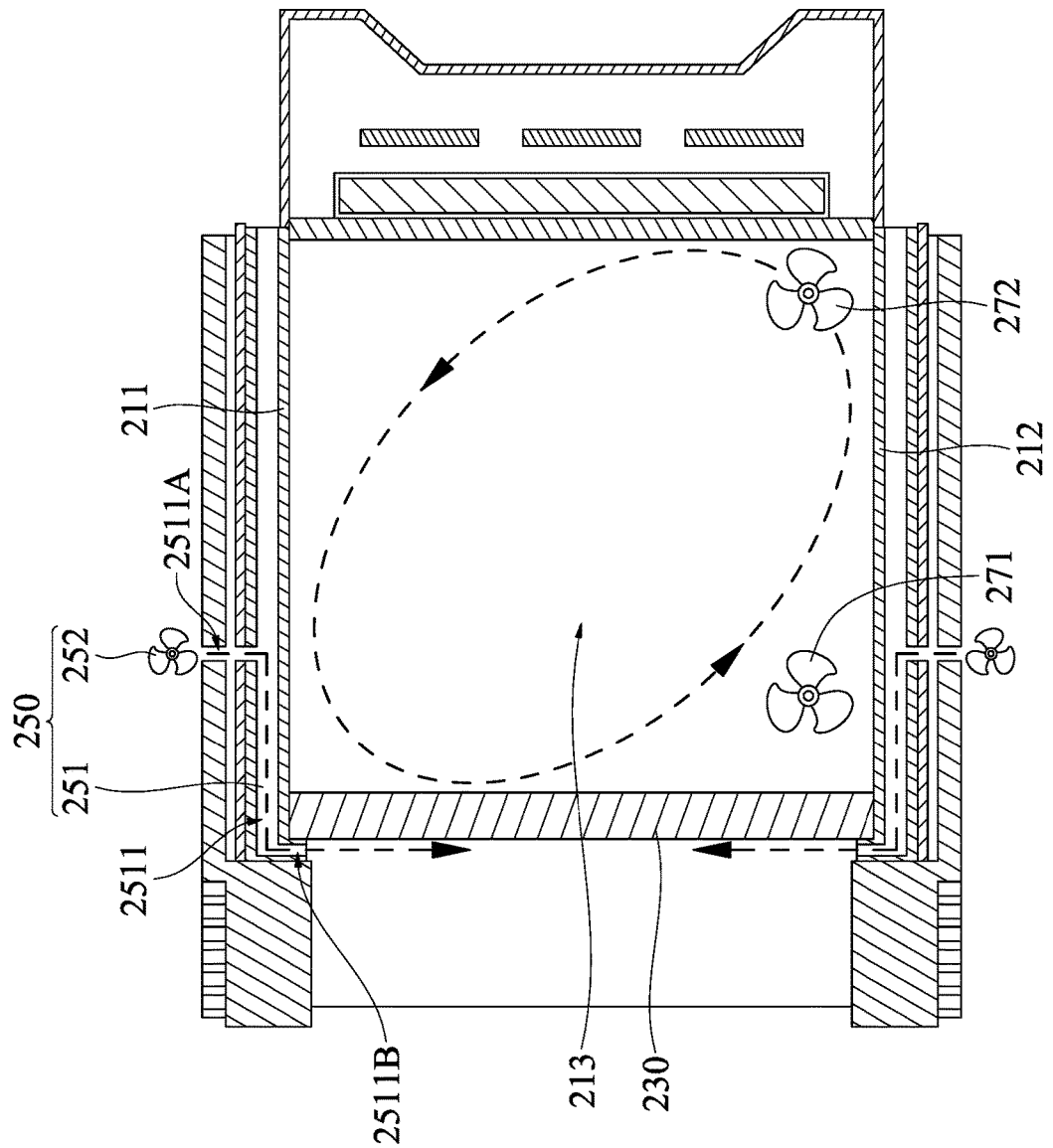
FIG. 7 is a schematic diagram of an inner space of a display device according to a third embodiment.
Figure 8:
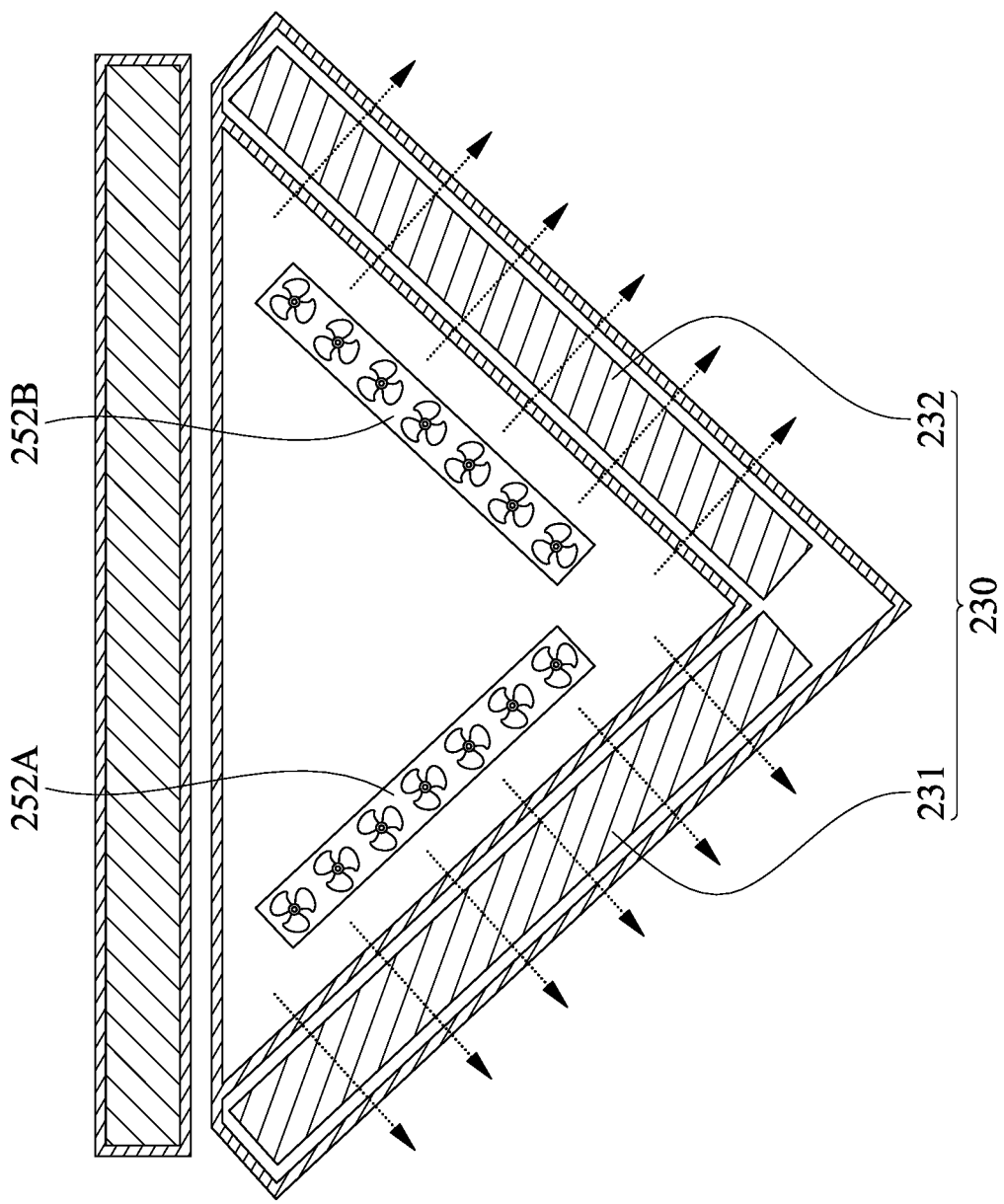
FIG. 8 is a schematic diagram of air flow of an air duct assembly of a display device according to a third embodiment.

Refer to FIG. 7 and FIG. 8. FIG. 7 is a schematic diagram of an inner space of a display device according to a third embodiment. FIG. 8 is a schematic diagram of air flow of an air duct assembly of a display device according to a third embodiment. The structure of the third embodiment similar to that of the first embodiment and the second embodiment is not repeated. Various implementations regarding the arrangement position of the fan element exist. According to an actual assembly condition and a requirement of the outdoor environment, as shown in FIG. 7, in the third embodiment, the first fan element 271 and the second fan element 272 are located on the same side of the inner space 213 and are arranged on opposite ends. In addition, each air duct element 251 of the two outer circulation assemblies 250 includes a flow channel 2511, an air inlet 2511A, and an air outlet 2511B. The air inlet 2511A is arranged in a direction perpendicular to a plane of the first side surface 211 and the second side surface 212, and the air outlet 2511B faces the panel 230. Further, as shown in FIG. 8, the fan assembly 252 includes a first fan set 252A and a second fan set 252B. The first fan set 252A is arranged parallel to the first panel portion 231. The second fan set 252B is arranged parallel to the second panel portion 232. The panel 230 can be dissipated evenly through the first fan set 252A and the second fan set 252B.

Figure 9:
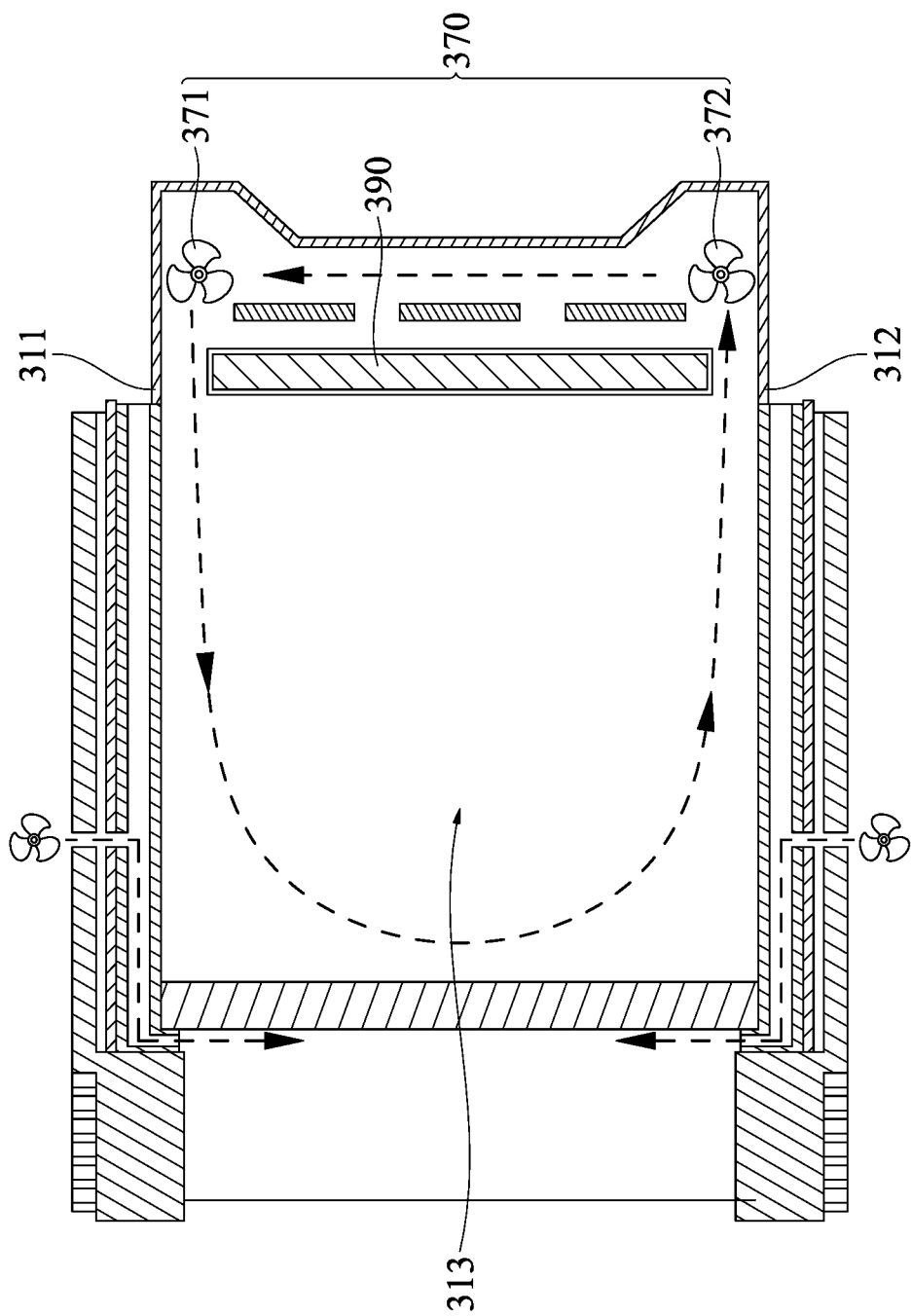
FIG. 9 is a schematic diagram of an inner space of a display device according to a fourth embodiment.

Refer to FIG. 9. FIG. 9 is a schematic diagram of an inner space of a display device according to a fourth embodiment. The structure of the fourth embodiment similar to that of the first embodiment, the second embodiment, and the second embodiment is not repeated. In the fourth embodiment, the first fan element 371 is arranged on an end of the optical device 390 close to the first side surface 311. The second fan element 372 is arranged on an end of the optical device 390 close to the second side surface 312. In this way, the first fan element 371 and the second fan element 372 of the inner circulation assembly 370 may form the air flow as shown in FIG. 9 to comprehensively dissipate heat from the inner space 313 and the optical device 390 located within the inner space 313.

Based on the above, a display device is provided according to an embodiment. The outer circulation assembly of the display device guides the air flow generated by the fan assembly to the panel through the air duct element. The inner circulation assembly dissipates heat from the inner space of the display device and the optical device located in the inner space by using the first fan element and the second fan element. In this way, through the inner circulation assembly and the outer circulation assembly independent from each other, heat dissipation is performed on both the outside and inside of the display device, and accumulation of thermal energy of the display device is reduced.

What is claimed is:

1. A display device, comprising:
a housing, comprising a closed inner space and a first side surface and a second side surface opposite to each other, wherein an air in the inner space and an air outside the inner space are not in communication with each other;
a panel, connected to the first side surface and the second side surface;
two outer circulation assemblies, respectively arranged on an outer side of the first side surface of the housing and an outer side of the second side surface of the housing, wherein each of the outer circulation assemblies comprises an air duct element and a fan assembly, and the air duct element guides an air flow generated by the fan assembly to the panel;
an inner circulation assembly, arranged in the inner space, wherein the inner circulation assembly comprises a first fan element and a second fan element, and the first fan element and the second fan element are arranged on two opposite ends; and an optical device, arranged in the inner space and located between the first side surface and the second side surface on an end opposite to the panel;

wherein an air flow of the two outer circulation assemblies and an airflow of the inner circulation assembly are independent from each other, the two outer circulation assemblies dissipate heat from the outside of the display device, and the inner circulation assembly dissipates heat inside the inner space.

2. The display device according to claim 1, wherein the air duct element of each of the two outer circulation assemblies comprises a flow channel, an air inlet, and an air outlet, the air inlet is arranged in a direction perpendicular to a plane of the first side surface and the second side surface, and the air outlet faces the panel.

3. The display device according to claim 1, wherein the air duct element of each of the two outer circulation assemblies comprises a flow channel, an air inlet, and an air outlet, the air inlet is arranged in a direction parallel to a plane of the first side surface and the second side surface, and the air outlet faces the panel.

4. The display device according to claim 1, wherein the panel has a first panel portion and a second panel portion, and the first panel portion and the second panel portion are arranged opposite to each other at an angle.

5. The display device according to claim 4, wherein the fan assembly comprises a first fan set and a second fan set, the first fan set is arranged parallel to the first panel portion, and the second fan set is arranged parallel to the second panel portion.

6. The display device according to claim 4, wherein the air duct element is provided with a flow guide structure, the flow guide structure has a plurality of first spacers and a plurality of second spacers, each of the first spacers has a first section and a second section, each of the second spacers has a third section and a fourth section, the first section and the third section extend away from the fan assembly, and the second section and the fourth section respectively extend toward the first panel portion and the second panel portion.

7. The display device according to claim 1, wherein the first fan element and the second fan element are arranged at opposite corners.

8. The display device according to claim 1, wherein the first fan element is arranged on an end of the optical device close to the first side surface, and the second fan element is arranged on an end of the optical device close to the second side surface.

9. The display device according to claim 1, further comprising a dust-proof element, wherein the dust-proof element is arranged between the inner circulation assembly and the optical device.

10. The display device according to claim 1, wherein the outer circulation assembly comprises a heat sink fin, a heat filter, and a cooling chip, the heat filter is arranged on the air duct element, the cooling chip is arranged on the heat filter, and the heat sink fin is arranged on the heat filter.

11. A display device, comprising:
a housing, comprising a closed inner space and a first side surface and a second side surface opposite to each other, wherein an air in the inner space and an air outside the inner space are not in communication with each other;

a panel, connected to the first side surface and the second side surface;

an outer circulation assembly, arranged on an outer side of the first side surface of the housing, wherein the outer circulation assembly comprises an air duct element and a fan assembly, and the air duct element guides an air flow generated by the fan assembly to the panel;

an inner circulation assembly, arranged in the inner space, wherein the inner circulation assembly comprises a fan element, and the fan element is arranged on end of the inner space; and an optical device, arranged in the inner space and located between the first side surface and the second side surface on an end opposite to the panel;

wherein an air flow of the outer circulation assembly and an airflow of the inner circulation assembly are independent from each other, the outer circulation assembly dissipates heat from the outside of the display device, and the inner circulation assembly dissipates heat inside the inner space.

12. The display device according to claim 11, wherein the air duct element of the outer circulation assembly comprises a flow channel, an air inlet, and an air outlet, the air inlet is arranged in a direction perpendicular to a plane of the first side surface, and the air outlet faces the panel.

13. The display device according to claim 11, wherein the air duct element of the outer circulation assembly comprises a flow channel, an air inlet, and an air outlet, the air inlet is arranged in a direction parallel to a plane of the first side surface, and the air outlet faces the panel.

14. The display device according to claim 11, wherein the panel has a first panel portion and a second panel portion, and the first panel portion and the second panel portion are arranged opposite to each other at an angle.

15. The display device according to claim 14, wherein the fan assembly comprises a first fan set and a second fan set, the first fan set is arranged parallel to the first panel portion, and the second fan set is arranged parallel to the second panel portion.

16. The display device according to claim 14, wherein the air duct element is provided with a flow guide structure, the flow guide structure has a plurality of first spacers and a plurality of second spacers, each of the first spacers has a first section and a second section, each of the second spacers has a third section and a fourth section, the first section and the third section extend away from the fan assembly, and the second section and the fourth section respectively extend toward the first panel portion and the second panel portion.

17. The display device according to claim 11, further comprising a dust-proof element, wherein the dust-proof element is arranged between the inner circulation assembly and the optical device.

18. The display device according to claim 11, wherein the outer circulation assembly comprises a heat sink fin, a heat filter, and a cooling chip, the heat filter is arranged on the air duct element, the cooling chip is arranged on the heat filter, and the heat sink fin is arranged on the heat filter.

* * * * *